(12) United States Patent
Miller

(10) Patent No.: US 7,994,803 B2
(45) Date of Patent: Aug. 9, 2011

(54) CALIBRATION SUBSTRATE

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/569,584

(22) Filed: Sep. 29, 2009

(65) Prior Publication Data

US 2010/0017662 A1 Jan. 21, 2010

Related U.S. Application Data

(62) Division of application No. 10/939,909, filed on Sep. 13, 2004, now Pat. No. 7,595,629.

(60) Provisional application No. 60/586,536, filed on Jul. 9, 2004.

(51) Int. Cl.
*G01R 31/00* (2006.01)

(52) U.S. Cl. ............... 324/750.01; 324/750.02

(58) Field of Classification Search .......... None
See application file for complete search history.

(56) References Cited

U.S. PATENT DOCUMENTS

| | | | |
|---|---|---|---|
| 4,249,258 A | 2/1981 | Craven | |
| 5,139,328 A | 8/1992 | Baker et al. | |
| 5,430,400 A * | 7/1995 | Herlein et al. | 327/108 |
| 5,646,558 A * | 7/1997 | Jamshidi | 326/106 |
| 5,712,427 A | 1/1998 | Matthews | |
| 6,105,157 A | 8/2000 | Miller | |
| 6,189,382 B1 | 2/2001 | Johnson | |
| 6,224,180 B1 | 5/2001 | Pham-Van-Diep et al. | |
| 6,281,699 B1 * | 8/2001 | Bishop | 324/765 |
| 6,448,799 B1 | 9/2002 | Niwa | |
| 6,449,568 B1 | 9/2002 | Gerrish | |
| 6,476,630 B1 | 11/2002 | Whitten et al. | |
| 6,606,575 B2 | 8/2003 | Miller | |
| 6,622,103 B1 | 9/2003 | Miller | |
| 6,708,123 B2 | 3/2004 | Gerrish | |
| 6,789,224 B2 | 9/2004 | Miura | |
| 6,798,225 B2 * | 9/2004 | Miller | 324/754 |
| 6,911,814 B2 | 6/2005 | Miller et al. | |
| 7,154,259 B2 | 12/2006 | Miller | |
| 7,375,508 B2 | 5/2008 | Bucksch | |
| 7,389,194 B2 * | 6/2008 | Nguyen et al. | 702/107 |
| 7,595,629 B2 | 9/2009 | Miller | |
| 2002/0075030 A1 | 6/2002 | Schittenhelm | |

FOREIGN PATENT DOCUMENTS

| | | |
|---|---|---|
| CN | 2524241 | 12/2002 |
| EP | 1283423 | 2/2003 |
| JP | 2007-010727 | 2/2007 |
| WO | WO 02/01234 | 1/2002 |

OTHER PUBLICATIONS

"A Gate-Array-Based 666 MHz VLSI Test System", article, Hitachi Ltd., p. 451-458, (1995).
Abstract Translation of CN 2524241, (Feb. 20, 2009).
Chinese Office Action, Feb. 20, 2009.

* cited by examiner

*Primary Examiner* — Vinh P Nguyen
(74) *Attorney, Agent, or Firm* — Kirton & McConkie

(57) ABSTRACT

A calibration substrate includes a plurality of input terminals, a detector coupled to the input terminals, and an output terminal. The calibration substrate can be used for calibrating and/or deskewing communications channels.

18 Claims, 10 Drawing Sheets

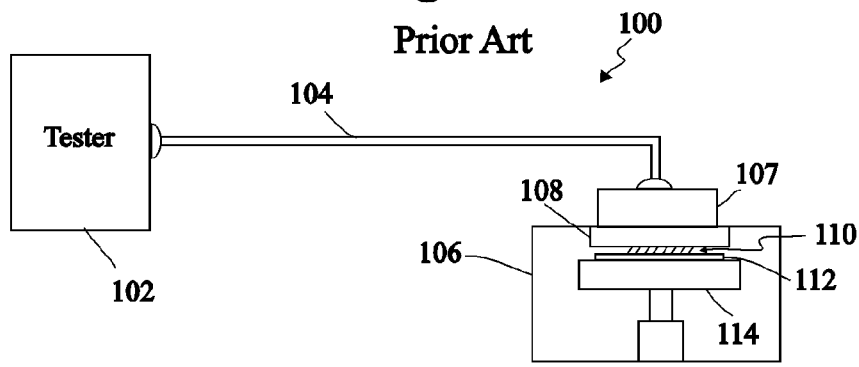
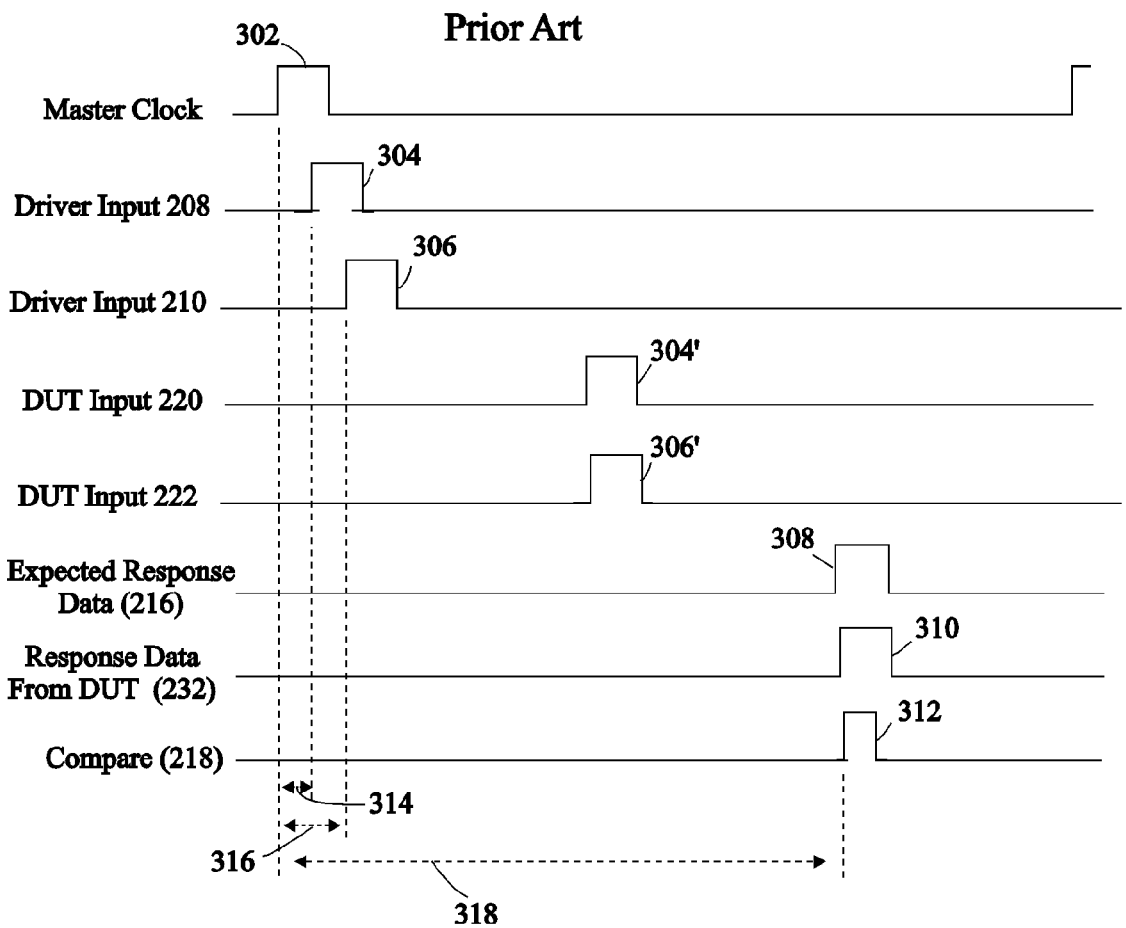

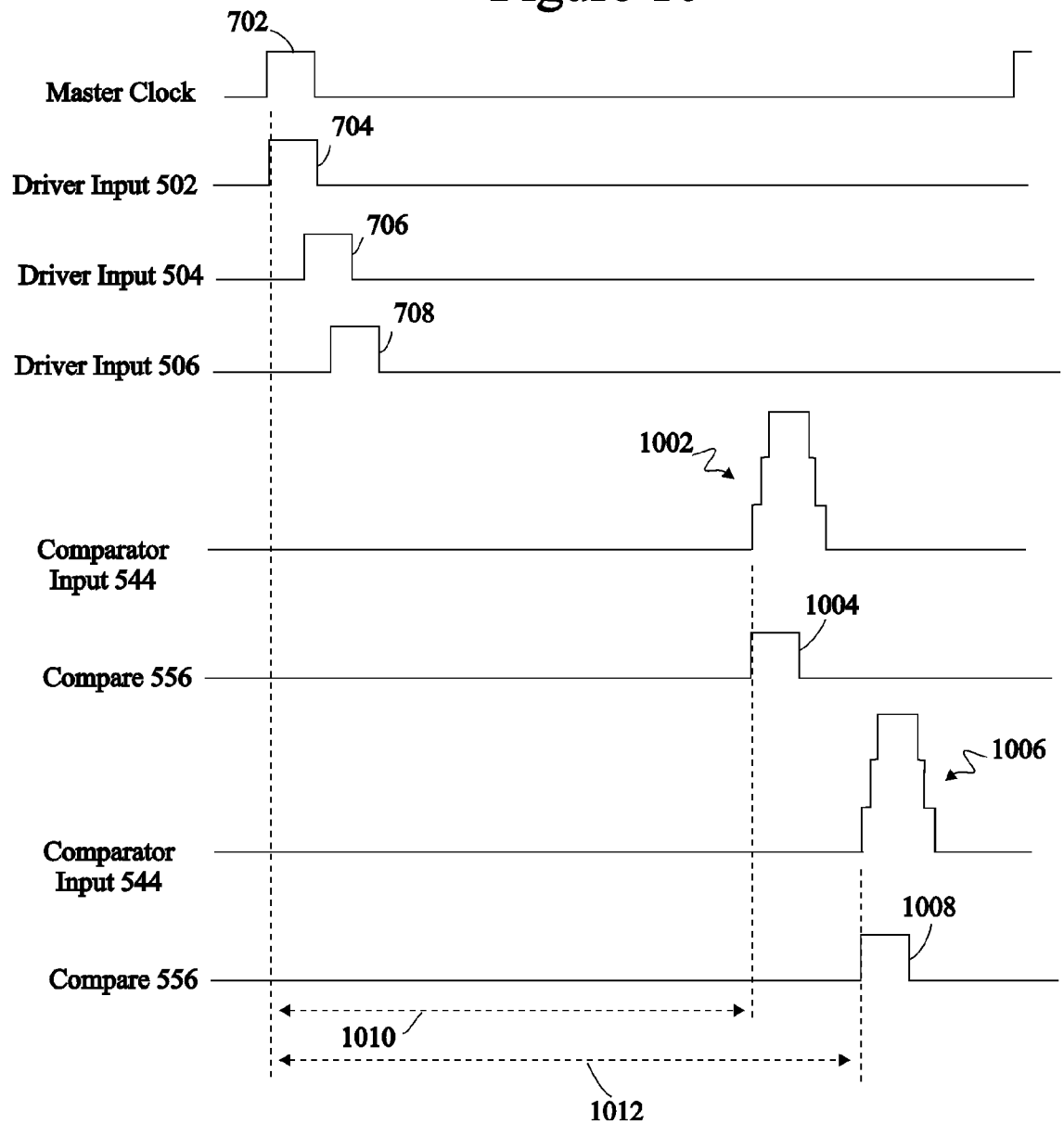

CALIBRATION SUBSTRATE

RELATED APPLICATIONS

This application is a division of U.S. patent application Ser. No. 10/939,909, filed Sep. 13, 2004 (now U.S. Pat. No. 7,595,629), which claims the benefit of U.S. Provisional Application 60/586,536, filed Jul. 9, 2004. The foregoing U.S. patent application Ser. No. 10/939,909 is incorporated herein by reference in its entirety.

BACKGROUND

This invention relates generally to calibrating and/or deskewing communications channels. Communications channels are used in any number of devices or systems, and in many such applications it may be advantageous to calibrate or deskew the communications channels. One nonlimiting example of the use of communications channels is a test system, such as for testing electronic devices.

FIG. 1 illustrates a simplified block diagram of an exemplary test system 100 for testing electronic devices, such as semiconductor devices. For example, the test system 100 of FIG. 1 may test the dies of an unsingulated wafer, singulated dies (packaged or unpackaged), or multi-chip modules. Such a system 100 may be configured to test other types of electronic devices, such as printed circuit boards, as well. As shown, the system 100 may include a tester 102, communications connection 104, probe head 107, and a probe card 108 for communicating test signals between the tester 102 and the electronic device under test ("DUT") 112. The test system 100 also may include a housing 106 with a moveable chuck 114 for supporting and moving the DUT 112. Probes 110 of the probe card make contact with the DUT 112 and thereby form electrical connections with the DUT.

The communications connection 104 (e.g., a coaxial cable, fiber optic, wireless link, etc.), test head 107, and probe card 110 form multiple communications channels (not shown in FIG. 1) between the tester 102 and terminals (not shown in FIG. 1) of the DUT 112. The tester 102 generates test data, which is driven through those communications channels (not shown in FIG. 1), to the terminals (not shown in FIG. 1) of the DUT 112. Response data generated by the DUT 112 travels in the reverse direction through other such communications channels (not shown in FIG. 1) back to the tester 102. In some test systems, the same communications channel is used for both test data and response data.

FIG. 2 illustrates a simplified block diagram of an exemplary tester 102 configured to test a DUT 112 that has two input terminals 220 and 222 and one output terminal 234. For example, DUT 112 may be a small memory with four one-bit storage cells. In response to a two-bit address input into input terminals 220 and 222, internal circuitry (not shown) in DUT 112 outputs through output terminal 234 the one-bit datum stored in the storage cell that corresponds to the address. (Of course, a memory DUT would typically have many more address inputs and many more data outputs and other inputs and outputs. The DUT 112 shown in FIG. 2 is simplified for purposes of illustration and discussion.)

As shown in FIG. 2, tester 102 includes a test data generator 202 that generates test patterns to be input into the input terminals 220 and 222 of DUT 112. In this example, each test pattern consists of two bits. Test data generator 202 outputs 204 the test patterns to a timing controller 206, which outputs 208, 210 each bit in the test pattern to drivers 212, 214. Drivers 212, 214 drive the test pattern through drive channels 216, 218 to input terminals 220, 222. As discussed above, although not shown in FIG. 2, channels 216, 218 may include paths through such things as a communications link (e.g., 104 in FIG. 1), a test head (e.g., 107 in FIG. 1), and a probe card (e.g., 108 in FIG. 1). Compare channel 232 (which may include the same paths as drive channels 216, 218) carries to the tester 102 the output generated by DUT 112 in response to the test pattern. (Herein, a communications channel (e.g., 216) for carrying test data from the tester 102 to the DUT 112 is referred to as a "drive channel" and a communications channel (e.g., 232) for carrying response data from the DUT 112 to the tester 102 is referred to as a "compare channel." It should be noted that, in many testers, a channel may be selectively set to function as a drive channel or a compare channel or to function as both a drive channel and a compare channel.) Comparator 228 compares the output generated by the DUT 112 to the expected response, which is input 226 to comparator 228. Results acquisition/analyzer 230 receives the results of the comparison and may also analyze the comparison to determine whether DUT 112 responded correctly to the test pattern. Test data generator 202, along with the test pattern, may also generate the expected response, and also output 226 the expected response to the timing controller 206. Timing controller 206 outputs 226 the expected response along with a compare signal 224 that activates comparator 228 at a time when the response data generated by the DUT is expected to arrive at the comparator 228 on channel 232.

As might be expected, timing of signals in the system shown in FIG. 2 is typically important. For example, it is typically important for the bits of the test pattern to arrive at the input terminals 220, 222 of DUT 112 at the same time or within a specified time difference. As another example, it is typically important for the expected response 226 and the compare signal 224 to be activated at the same time as or within a specified time difference of the arrival from DUT 112 of response data at comparator 228 on compare channel 232. In many applications, differences in the propagation delay of a signal through the drive channels 216, 218 and compare channel 232 must be compensated for.

FIG. 3 shows an exemplary timing chart for signals in the system of FIG. 2. In the example shown in FIG. 3, all timing is relative to the rising edge of a master clock 302, which may be generated in timing controller 206 or elsewhere in tester 102. Of course, something other than the rising edge of a master clock may be used as a timing reference. As shown in FIG. 3, timing generator 206 delays the output 208, 210 (see FIG. 2) of each bit of a test pattern by different offsets 314, 316 so that the bits in the test pattern arrive at the input terminals 220, 222 of DUT 112 (see FIG. 2) at the same or approximately the same time despite differences in the propagation delays through drive channels 216, 218. In the example shown in FIG. 3, the bit (represented in FIG. 3 by pulse 304) input 208 to driver 212 is delayed by a time offset 314, and the bit (represented in FIG. 3 by pulse 306) input 210 to driver 214 is delayed by a time offset 316. As also shown in FIG. 3, this causes the bits to arrive at the input terminals 220, 222 of DUT 112 at the same or approximately the same time. (The bit input 208 to driver 212 and driven down drive channel 216 is represented as it arrives at input terminal 220 by pulse 304' in FIG. 3; similarly, the bit input 210 to driver 214 and driven down drive channel 218 is represented as it arrives at input terminal 222 by pulse 306' in FIG. 3.) Of course, offset 314 may be zero. Offset 318 in FIG. 3 represents the delay from the timing reference (in this example, the rising edge of master clock pulse 302) to the presentation of expected response data 226 and the compare signal 224 to the comparator 228 (see FIG. 2). (In FIG. 3, the expected response data is represented by pulse 308, and the compare signal is represented by pulse 312. As shown in FIG. 3, offset 318 is set so that the compare signal (pulse 312 in FIG. 3) coincides with the arrival at comparator 228 of response data from DUT 112 on compare channel 232.

Offsets 314, 316, and 318 may be stored in a memory table or array (not shown) in timing controller 206. Moreover, each offset 314, 316, and 318 may comprise multiple parts. For example, a test system, such as test system 100 in FIG. 1, may be initially calibrated without a probe card 108, and later deskewed with a probe card 108. Each offset 314, 316, and 318 may therefore comprise a calibration delay representing the delay through a part of a corresponding drive or compare channel from the tester 102 to the interface (not shown) between the test head 107 and the probe card 108 and a deskew delay representing the delay through the probe card. The term "calibrate" is often used to refer to setting timing delays or timing offsets to make the propagation delays to the interface between the probe head 107 and the probe card 108 equal, and the term "deskew" is often used to refer to setting an addition timing delay or offset to compensate for differences in propagation delays through the probe card. In this application, however, the terms "calibrate" and "deskew" are used broadly and synonymously to include the determination and/or setting of any timing delay or offset, whether related to part or all of a channel. The terms "time delay" and "offset" are also used broadly and synonymously.

There is a need for improved methods and apparatuses for determining calibration and/or deskew offsets.

BRIEF SUMMARY

In an embodiment of the invention, a calibration substrate electrically connects the drive channels and the compare channels of a tester together. A pulse, a series of pulses, or a periodic waveform is driven down each drive channel, which creates a composite pulse, a series of composite pulses, or a composite waveform at the shorting node or summing junction of the calibration substrate or substrate. This composite pulse, series of composite pulses, or composite waveform is distributed to the compare channels from the summing junction of the calibration substrate. The summing junction may also be routed to a power detection circuit. Each composite pulse or the composite waveform is a composition or summation of the individual pulses or waveforms from the drive channels. Timing offsets associated with the drive channels are adjusted until the individual pulses of the composite pulse align or closely align. This may be accomplished by individually adjusting the timing of each of the pulses to achieve maximum power spectral density of the composite waveform. Those timing offsets calibrate and/or deskew the drive channels, compensating for differences in the propagation delays through the drive channels. After alignment of the drive channels is achieved, a composite pulse or a composite waveform may be subsequently used by the tester as a signal reference source to calibrate offsets for the compare channel.

BRIEF DESCRIPTION OF THE DRAWINGS

FIG. 1 illustrates an exemplary test system.
FIG. 3 illustrates an exemplary timing chart that corresponds to the tester and DUT of FIG. 2.
FIG. 10 illustrates another exemplary timing chart that corresponds to FIGS. 4 and 5.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 4:
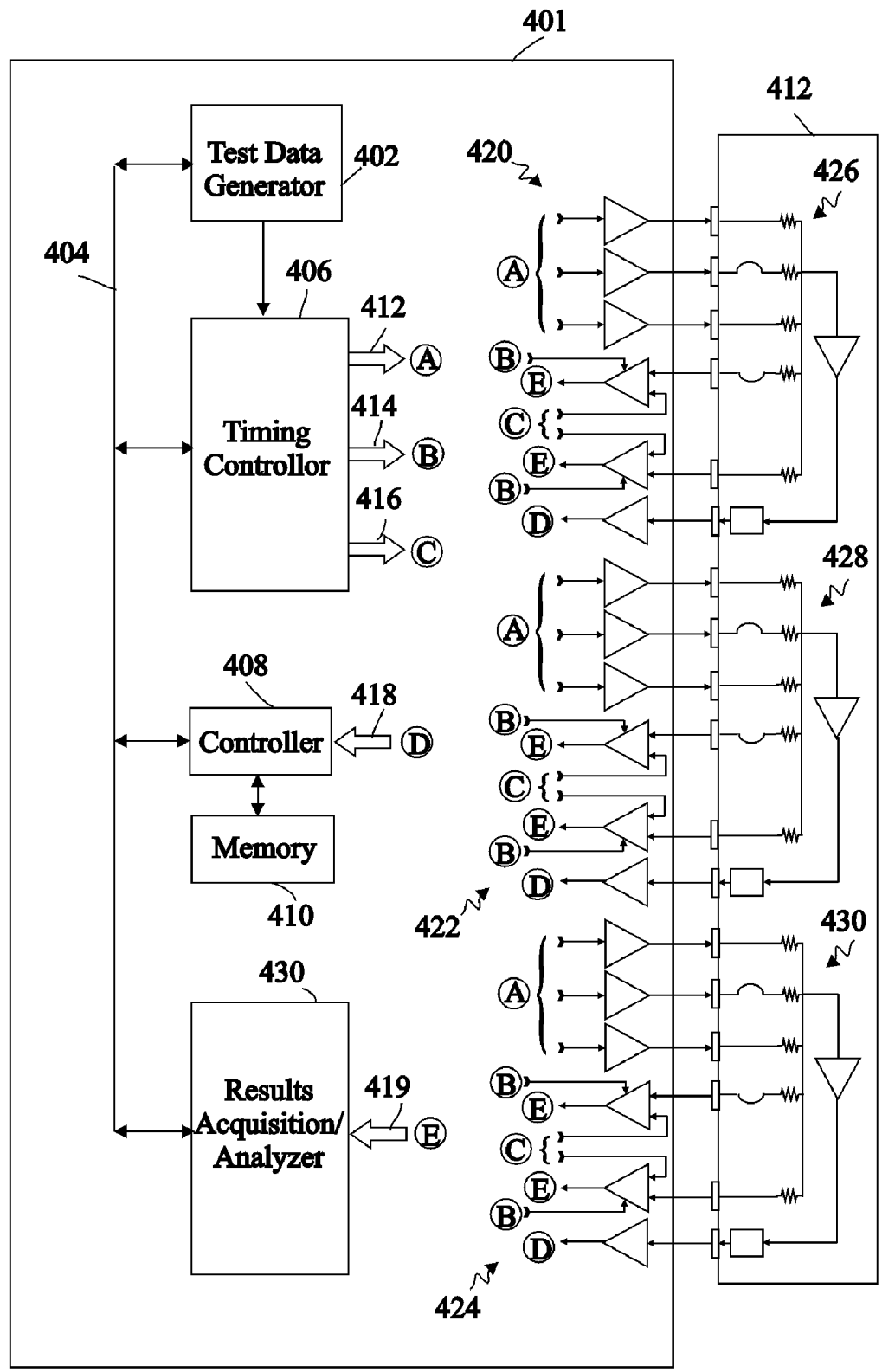
FIG. 4 illustrates an exemplary tester and calibration substrate.

FIG. 4 illustrates an exemplary calibration substrate 412 that may be used to determine calibration offsets and/or deskew offsets for drive and compare channels associated with exemplary tester 401. For illustration and discussion purposes (and not by way of limitation), tester 401 is shown in FIG. 4 as having eighteen channels. Again for purposes of illustration and discussion and not by way of limitation, tester 401 is configured to test DUTs that are read-only-memories (ROMs) with three input terminals and two output terminals. For example, the ROMs may have four two-bit storage cells, and the input terminals may include one read-enable terminal and two address terminals; the output terminals may include two data output terminals. In this example, the eighteen channels of tester 401 are configured as followed: nine are configured to be drive channels for driving the input terminals of three DUTs; six are configured to be compare channels for receiving output from the output terminals of the three DUTs (not shown); and three are not used. Thus configured, tester 401 is capable of testing three DUTs (not shown) in parallel.

Figure 2:
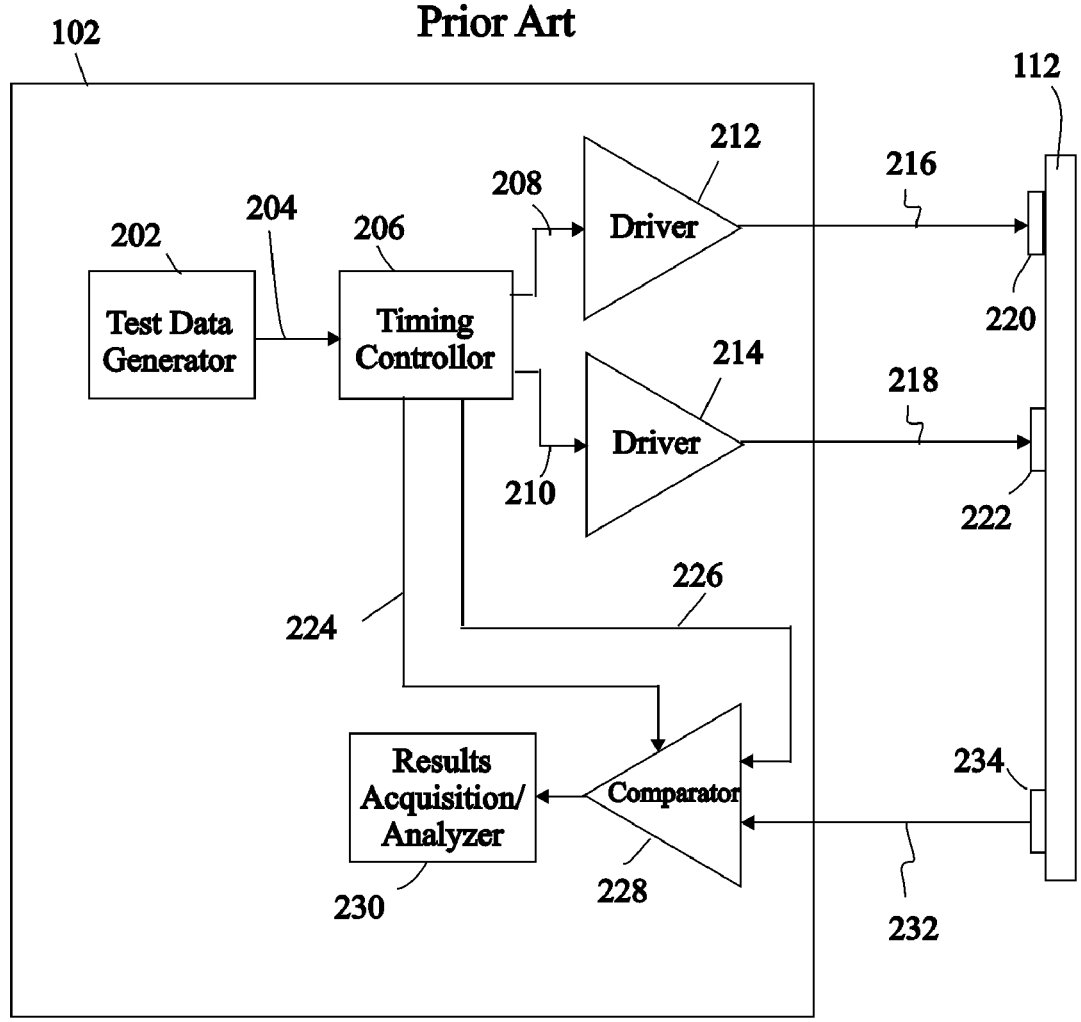
FIG. 2 illustrates an exemplary tester and DUT.

As shown in FIG. 4, tester 401 includes a test data generator 402, timing controller 406, and results acquisition/analyzer 430, which may be generally similar to like named elements in FIG. 2. Tester 401 also includes a controller 408 and associated memory 410. Controller 408 may be a microprocessor or microcontroller operating under control of software (including firmware or microcode) stored in memory 410, which may be any type of memory including without limitation semiconductor based memories, magnetic based memories, optical based memories, etc. Alternatively, controller 408 may be implemented in hardwired circuitry or as a combination of software operating on a microprocessor or microcontroller and hardwired circuitry. As shown, bus 404 provides data communication within tester 401.

As shown in FIG. 4, the tester channels are divided into three groups 420, 422, and 424, each of which is configured to interface with one DUT (not shown). Each channel group 420, 422, and 424 includes six channels: three drive channels, two compare channels, and an unused channel. Timing controller 406 outputs 412 test data patterns generated by test data generator 402 to the inputs of each of the drive channels (identified as "A" in FIG. 4). Timing controller 406 outputs 416 expected response data to one input of each comparator in each compare channel, and timing controller 406 also outputs 414 compare signals to each comparator. (Expected response data outputs and inputs are identified as "C" in FIG. 4, and compare signals are identified as "B" in FIG. 4.) Results acquisition/analyzer 430 receives as input 419 the output of each of the comparators at the end of each compare channel. (The output of the comparators and the input to results acquisition/analyzer 430 are identified as "E" in FIG. 4.) As will be discussed in more detail below, the unused channel in each channel group 420, 422, and 424 may be configured to function as a calibration channel; that is, the unused channel may be configured to return data to the tester 401 that is used to calibrate another channel in the channel group. In the example shown in FIG. 4, the unused channel in each channel group 420, 422, and 424 is configured to function as a calibration channel, and the output of each such channel is input 418 to controller 408 and identified as "D" in FIG. 4. It should be noted, however, that a calibration channel need not be an unused channel. For example, a calibration channel may be a channel normally used to provide power or ground during testing, a channel that corresponds to an unused probe, a compare channel, or a channel that corresponds to an input and/or output terminal on a DUT that does not require calibration or that is calibrated in a separate step or procedure. Herein, the term "calibration channel" is used broadly to refer to any such channel or, indeed, any channel that may be used to return data to the tester 401 that is used to calibrate another channel. Similarly, the term "calibration probe" is used broadly to refer to a probe that corresponds to any such calibration channel.

In the example shown in FIG. 4, calibration substrate 412 includes three sets of calibration circuitry 426, 428, and 430, which correspond to each of the channel groups 420, 422, and 424 in tester 401.

Figure 5:
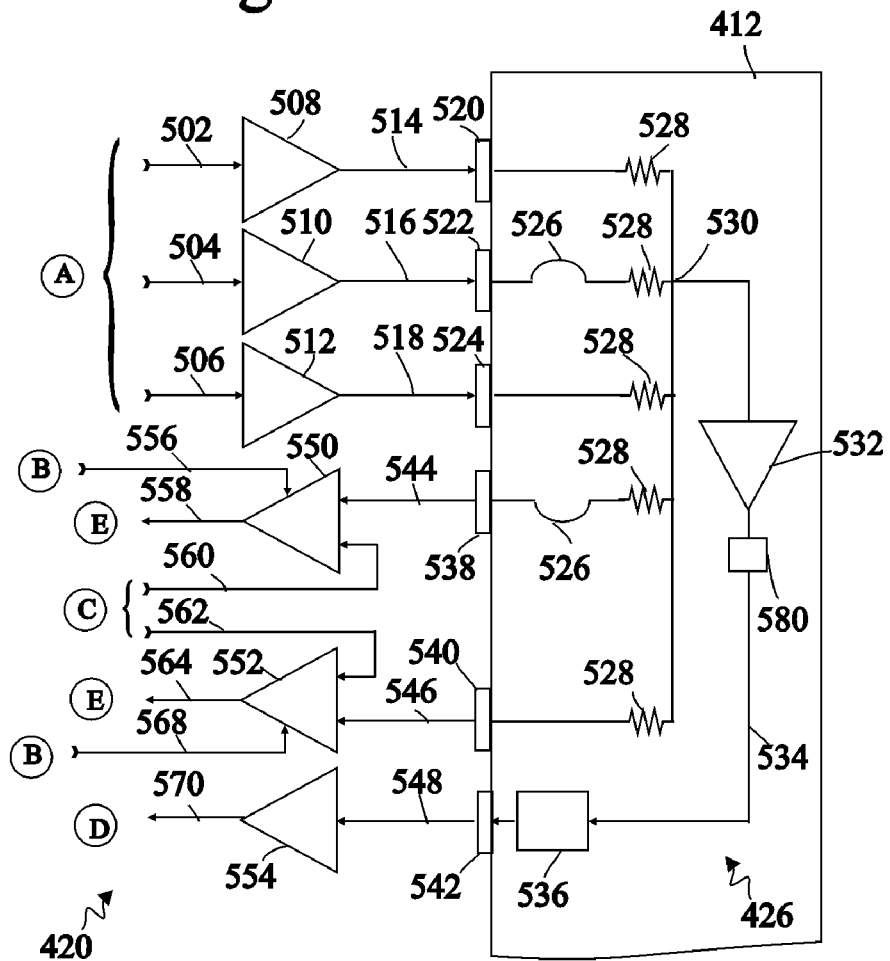
FIG. 5 illustrates a portion of the tester and calibration substrate of FIG. 4 and an exemplary configuration of a set of calibration circuitry.

FIG. 5 shows a partial view of calibration substrate 412 and a detailed view of one set of calibration circuitry 426 and the corresponding tester channel group 420. The other two sets of calibration circuitry 428 and 430 may be similarly configured and connected to the other two tester channel groups 422 and 424, which may be similar to the configuration of channel group 420 in FIG. 5.

Referring to FIG. 5, the first tester channel group 420 consists of three drivers 508, 510, and 512 for driving drive channels 514, 516, and 518, respectively, which are used to drive test data into a DUT (not shown). The inputs to drivers 508, 510, and 512 are inputs 502, 504, and 506, which as shown in FIG. 5, receive test data generated by test generator 402 and output by timing generator 406 (see FIG. 4). As also shown in FIG. 5, the first tester channel group 420 also includes two compare channels 544 and 546, which are used to receive response data generated by the DUT (not shown) in response to the test data. Compare channels 544 and 546 include comparators 550, 552, which are activated by compare signals 556 and 568, respectively. Expected response data 560, 562 is input to each comparator 550, 552, respectively. As also shown in FIG. 5, the first tester channel group 420 also includes a channel 548 that is not used to test a DUT, and in this example, the unused channel 548 is configured as a calibration channel that will return the output of detector 536 to the tester 401.

Still referring to FIG. 5, the first set of calibration circuitry 426 on or within calibration substrate 412 includes three input terminals 520, 522, and 524 for contacting the ends of drive channels 514, 516, and 518, which are driven by drivers 508, 510, and 512, whose inputs are 502, 504, and 506. Calibration substrate 412 connects the input terminals 520, 522, 524 to the output terminals 538, 540 through optional resistors 528, which may be sized to reduce or eliminate reflections of pulses and/or to scale the magnitude of the voltage at a summing junction 530, which is input to a buffer 532. The lengths of the conductive paths from each of input terminals 520, 522, 524 to each of output terminals 538, 548 and to the buffer 532 may be made to be of equal length or approximately of equal delay by including zigs, zags, or curves 526 as needed to make the paths equal or approximately equal length and thus of equal delay.

As shown in FIG. 5, the output 534 of buffer 532, which may be filtered 580, is connected to a detector 536, whose output is connected to calibration output terminal 542, which is connected to the unused/calibration channel 548. The configuration of the acquisition block 554 that corresponds to unused/calibration channel 558 may take many forms and may depend on the detector 536 output configuration. For example, detector 536 may be a power detector, and if detector 536 outputs an analog DC voltage proportional to power at the summing junction 530, the acquisition block 548 might be DC voltage measurement circuit. The detector 536 might include an A/D converter that outputs a digital number proportional to the power at summing junction 530. In this case, acquisition block 544 might be either a parallel or serial digital interface. It should be noted that detector 536 need not be a power detector. For example, when the individual pulses in the composite pulse are aligned, the rising and falling edges of the composite pulse are at a maximum slope and the pulse width is at a minimum. Therefore, any detector that detects any or all of these composite pulse features can be used to detect individual pulse alignment.

As mentioned above, channels other than an unused channel may be configured to function as a calibration channel, and thus, in FIG. 5, unused/calibration channel 548 may be eliminated and the output of detector 536 connected to one of the compare channels 544 or 546 or any other channel that is available during calibration to return calibration data to the tester 401. If one of compare channels 544 or 546 is configured as a calibration channel, a switch (not shown) may be included to switch the compare channel 544 or 546 between the output of the detector 536 and the summing junction 530.

Another alternative that should be mentioned includes implementing the detector 536 in a location other than on the calibration substrate 412. For example, the detector 536 may be implemented in whole or in part as software running on controller 408 in tester 401. Such software may be configured to detect the power in a pulse or the edge slope or width of a pulse.

As mentioned above, the output of buffer 532 may optionally be filtered, for example, by a high pass or band pass filter 580 configured to select or remove certain DC or harmonic content from the output of buffer 532. Depending on the detector type and the pulse or periodic waveform, improved power sensitivity can be achieved by selectively measuring the power at DC or at a harmonic of the periodic waveform. It should be noted that the precise location of elements 532, 580 and 536 is not critical, and these components can be located on the calibration substrate as shown in FIG. 5, or on the probe card 106 of FIG. 1, the test head 107 of FIG. 1, or in the tester 102 of FIG. 1, among other places.

The input terminals 520, 522, and 524 and output terminals 538, 540, and 542 of calibration substrate 412 may be brought into temporary contact with the probes of a probe card (similar to probes 110 and probe card 108 in FIG. 1), in which case the probes of the probe card represent the ends of the drive channels 514, 516, 518; the compare channels 544, 546; and the unused/calibration channel 548. In such a case, the calibration substrate 412 may be used to calibrate and/or deskew tester channels (drive and compare) from the tester to the ends of the probes. Alternatively, if part of the channels have already been calibrated or deskewed, the calibration substrate 412 may be used to calibrate or deskew the part of the channels that have not been calibrated or deskewed. For example, the tester channels may be initially calibrated from the tester to the interface between the test head (e.g., 107 in FIG. 1) and the probe card (e.g., 108 in FIG. 1) and the results of that calibration stored as timing offsets in timing controller 406. In such a case, calibration substrate 412 may be used to determine additional timing offsets (e.g., as discussed above) to deskew the parts of the tester channels that correspond to the probe card. The input terminals 520, 522, 524 and output terminals 538, 540, 542 of calibration substrate 412 need not, however be connected to probes of a probe card but may be connected to any points along the tester channels and used to calibrate and/or deskew any portion of the channels. For example, the terminals of calibration substrate may be connected to a test head (e.g., 107 in FIG. 1). (As mentioned above, the terms "calibrate" and "deskew" are used in this specification broadly and synonymously to include the determination and/or setting of any timing delay or offset, whether related to part or all of a channel.)

The calibration substrate 412 may be made of any type of substrate that is capable of supporting electrical components such as traces, resistors, buffers, filters, detectors, terminals, etc. Examples of such substrates include without limitation a semiconductor wafer, a printed circuit board, a ceramic material, etc. In addition, the electrical components may be disposed in whole or in part on a surface of the substrate and/or within the substrate. Moreover, the calibration substrate 412 may be located on the chuck 114 (see FIG. 1) during calibration, after which the calibration wafer 412 may be removed and replaced with one or more DUTs. Alternatively, the calibration substrate 412 may be located on a second chuck (not shown) located in a housing (e.g., 106 of FIG. 1) of, for example, a prober (not shown).

Figure 6:
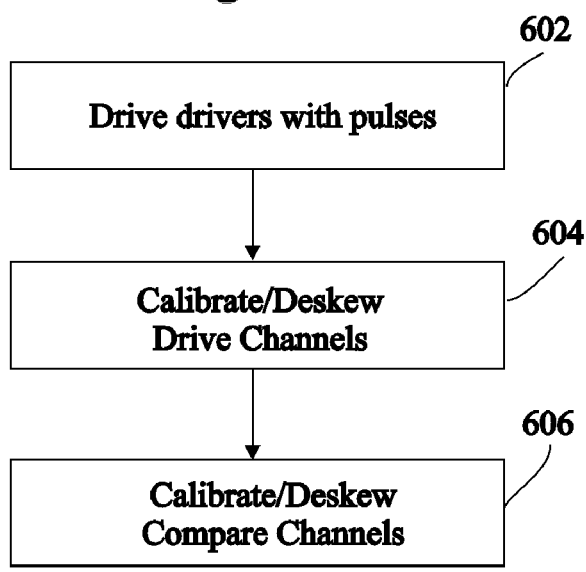
FIG. 6 illustrates an exemplary process for calibrating and/or deskewing the channels of FIGS. 4 and 5.

FIG. 6 illustrates an exemplary process in which calibration substrate 412 is used to calibrate the drive channels and compare channels of tester 401. FIG. 6 will be discussed with reference to the drive channels 514, 516, and 518, compare channels 544 and 546, and the unused/calibration channel 548 that correspond to tester channel group 420 and calibration circuitry 426 shown in FIG. 5. Nevertheless, the process shown in FIG. 6 is also applicable to tester channel groups 422 and 424 and calibration circuitry 428 and 430. Indeed, the process of FIG. 6 may be performed simultaneously on the drive and compare channels of each of the tester channel groups 420, 422, and 424. As should be apparent, the tester channel groups 420, 422, and 424 each correspond to a DUT (not shown), that is, each tester channel group 420, 422, and 424 is configured to test one DUT (not shown) after calibration and/or deskewing. Thus, in the example shown in FIGS. 4-6, each set of calibration circuitry 426, 428, 430 is configured to calibrate or deskew a tester channel group 420, 422, 424 that corresponds to one DUT. The calibration substrate 412 is thus configured to calibrate or deskew the tester channels on a per DUT basis. Such a per-DUT configuration is, of course, optional. In addition, the particular configuration of three drive channels, two compare channels, and one unused channel per DUT is also optional and in fact, simplified for purposes of discussion. Most DUTs require many more drive and compare channels. The process illustrated in FIG. 6 is applicable to any configuration of drive and compare channels.

The process illustrated in FIG. 6 may be implemented in whole or in part as software being executed by controller 408. Alternatively, the process illustrated in FIG. 6 may be implemented in hardwired circuitry or in a combination of software and hardwired circuitry. Moreover, the process illustrated in FIG. 6 may be fully automated and require no user intervention other than to start the process. Alternatively, the process of FIG. 6 may be implemented entirely manually by a user or may be implemented in part automatically and in part manually.

Initially, calibration substrate 412 is placed on a chuck (e.g., 114 in FIG. 1) and its terminals (e.g., 520, 522, 524, 538, 540, and 542) brought into contact with the probes of a probe card (e.g., probes 110 of probe card 108 of FIG. 1). Then, at step 602 in FIG. 6, a pulse, a series of pulses, or a periodic waveform is simultaneously driven onto each of the drive channels 514, 516, and 518. In this example, a series of pulses are driven down each drive channel, but one pulse could alternatively be driven down each driven channel or a waveform could be driven down each drive channel.

Test data generator 402 may generate the pulses, which are output by timing controller 406 to the inputs 502, 504, and 506 of drivers 508, 510, and 512. The series of pulses may be the equivalent of driving a square wave down each of the drive channels 514, 516, and 518. As shown in FIG. 5, the pulses are received at input terminals 520, 522, and 524, combined at summing junction 530 and input into buffer 532. As mentioned above, optional resistors 528 may be sized to match the impedance of the drive channels 514, 516, and 518 and buffer 532, but are generally not required for the tester application. As also mentioned above, zigs, zags, or curves 526 may be included so that the electrical paths through calibration substrate 412 to buffer 532 are the same length for all input signals. Buffer 532 may include an amplifier for, for example, signal or impedance scaling, or the buffer 532 may be eliminated. The output 534 of buffer 532 is a composite waveform consisting of the summation of the pulses driven down drive channels 514, 516, and 518.

Figure 7A:
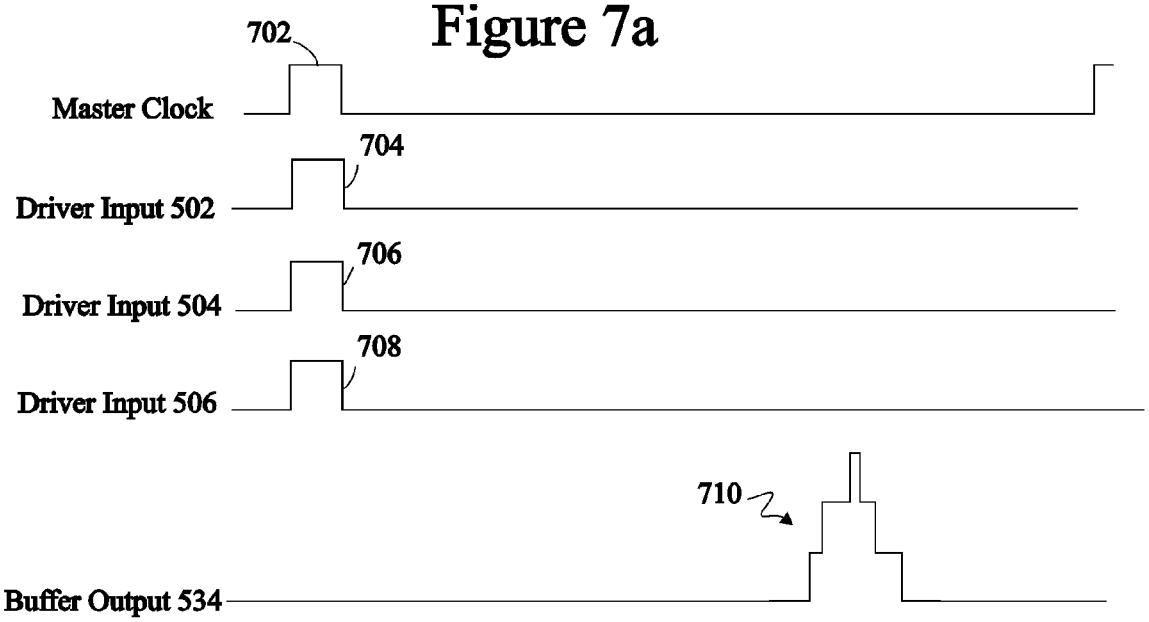
FIG. 7a, FIG. 7b, and FIG. 8 illustrate exemplary timing charts that corresponds to the tester and calibration substrate of FIG. 4 and FIG. 5.
Figure 7B:
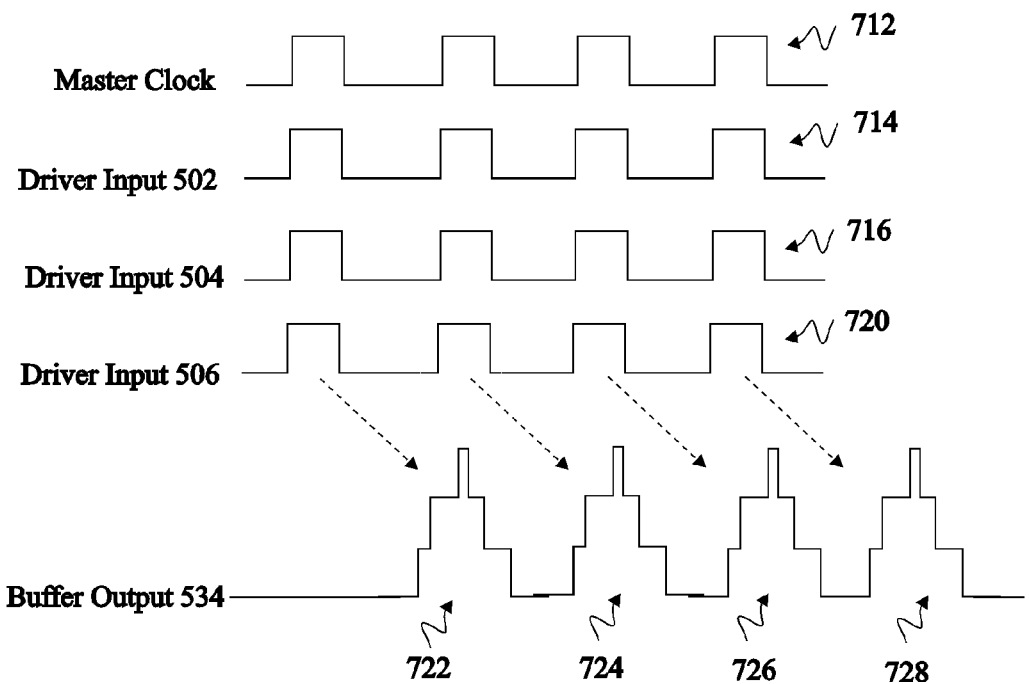

FIG. 7*a* illustrates an exemplary composite pulse 710 that may appear at the output 534 of buffer 532. FIG. 7*a* also shows exemplary pulses input 502, 504, 506 to drivers 508, 510, 512 and driven down the three drive channels 514, 516, and 518: pulse 704 input to driver 508 and is driven down drive channel 514, pulse 706 is driven down drive channel 516, and pulse 708 is input 506 to driver and driven down drive channel 518. In FIG. 7*a*, pulses 704, 706, and 708 are shown coinciding with master clock pulse 702, which is a system clock generated within tester 401 as a reference. Thus, in FIG. 7*a*, pulses 704, 706, and 708 are shown as they are input 502, 504, and 506 into drivers 508, 510, and 512. An example of a composite pulse 710, which appears a short time later at the output 534 of buffer 532, is shown in FIG. 7*a*. As should be apparent, composite pulse 710 is the sum of overlapping but askew pulses 704, 706, and 708 at the output 534 of buffer 532. The pulses 704, 706, and 708 are askew at the output of buffer 532 because of differences in the propagation delay through drive channels 514, 516, and 518. As shown in FIG. 7*b*, as a series of such pulses 714, 716, 718, 720 are driven down each of drive channels 514, 516, and 518 (exemplary pulse series 714, each of which may be similar to pulse 704 shown in FIG. 7*a*, are input 502 to driver 508 and driven down drive channel 514; exemplary pulse series 716, each of which may be similar to pulse 706 in FIG. 7*a*, are input 504 to driver 510 and driven down drive channel 516; and exemplary pulse series 716, each of which may be similar to pulse 708 shown in FIG. 7*a*), a series of composite pulses 722, 724, 726, 278 appears at the output 534 of buffer 532. (A series of master clock pulses 712 is also shown in FIG. 7b.)

Figure 8:
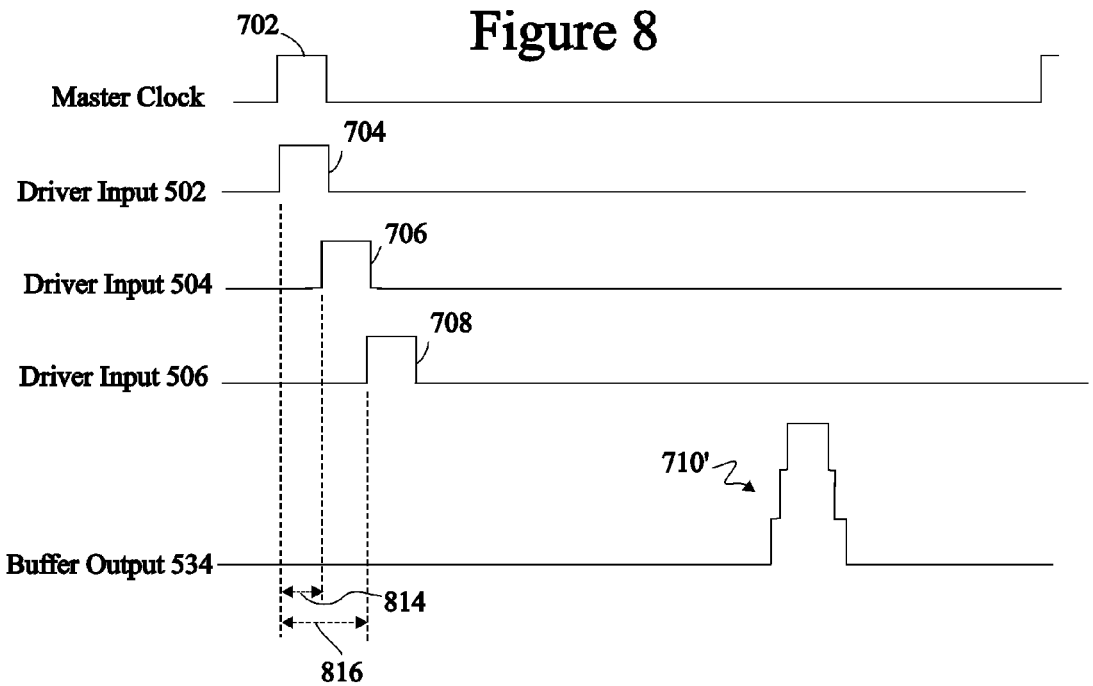

Referring again to FIG. 6, as pulses are being driven down drive channels 514, 516, and 518 at step 602, the drive channels are calibrated and/or deskewed at step 604. The drive channels 514, 516, and 518 may be calibrated or deskewed by adjusting the timing offsets within timing control 406 associated with each of the drive channels 514, 516, and 518 until the overlapping askew pulses at the output 534 of buffer 532 align. For example, as shown in FIG. 8, pulse 706 is delayed for a time delay 814 (from the rising edge of the master clock 702) by timing controller 406 before being input 504 to drive 510, and pulse 708 is delayed for a time delay 816 before being input 506 to driver 512. In the example shown in FIG. 8, pulse 704, which is input 502 to driver 508, is not delayed, although it too also could be delayed. As also shown in FIG. 8, the offsets 814 and 816 are chosen such that the three pulses 704, 706, and 708 that form the composite pulse 710 align at the output 534 of buffer 532, forming an aligned composite pulse 710. The time delays 814 and 816 and a time delay for pulse 704 (which in the example shown in FIG. 8 is zero) may be stored in timing controller 406 and used while testing DUTs (not shown). The drive channels 514, 516, and 518 are now calibrated and/or deskewed.

Note that, as shown in FIG. 8, composite pulse 710 is not perfectly aligned because, under some circumstances, it may not be desirable or possible to perfectly align the pulses. Nevertheless, the more aligned the pulses in composite pulse 710, the more accurate the timing offsets.

Figure 9:
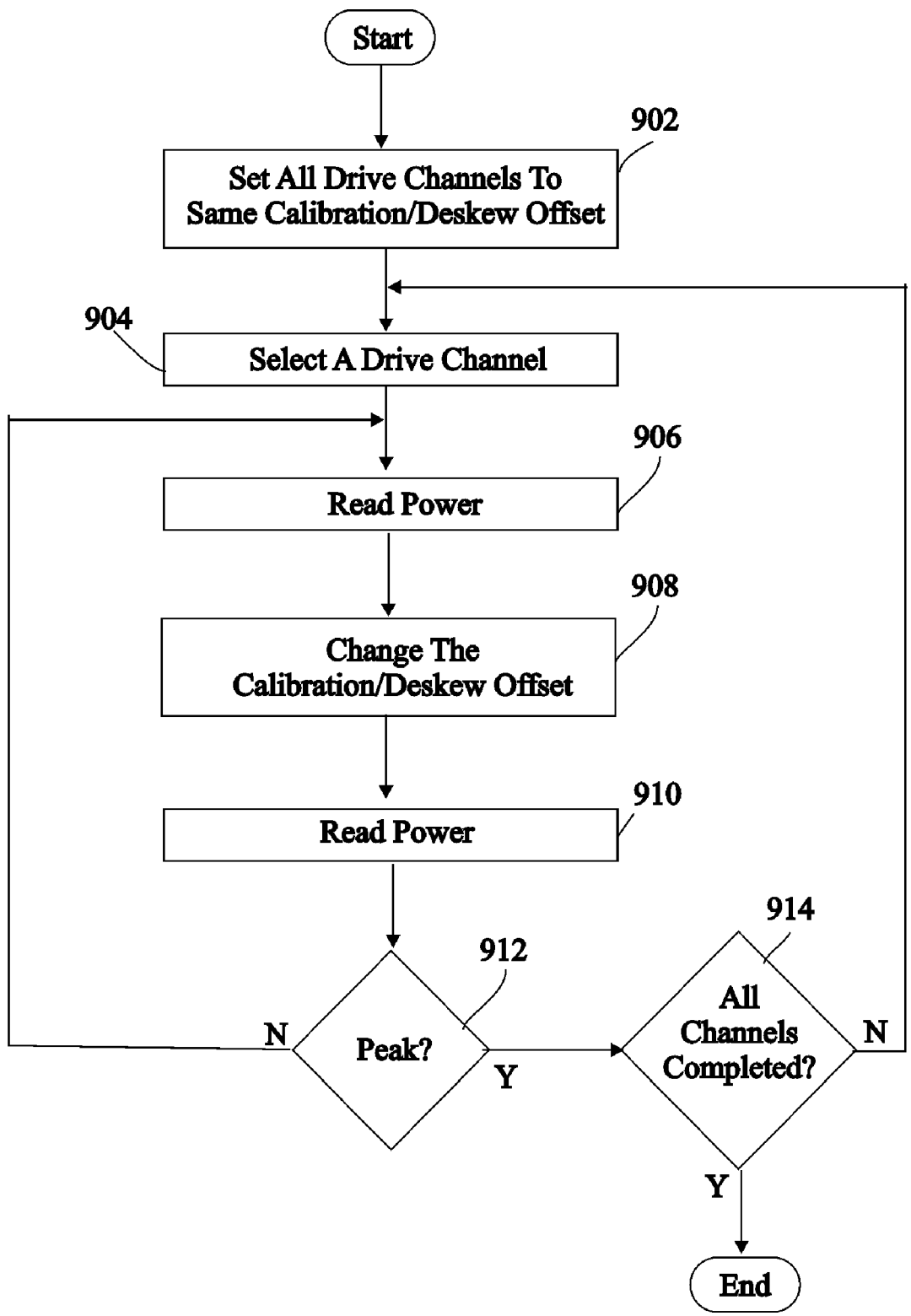
FIG. 9 illustrates an exemplary process for implementing step 604 of FIG. 6.

FIG. 9 illustrates an exemplary method of calibrating and/or deskewing the drive channels 514, 516, 518 at step 604 of FIG. 6. At step 902, the offsets at the timing controller 406 that are to be calibrated or deskewed are set the same for all of the drive channels 514, 516, and 518. For example, the offsets may be set to zero. At step 904, a single drive channel is selected as the drive channel to be calibrated or deskewed.

At step 906 the power of the composite pulses 710 (FIG. 7a) is determined. Detector 536, into which the output 534 of buffer 532 is input (see FIG. 5), may be a power meter. For example, detector 536 may determine the root-mean-square (RMS) voltage of the series of composite pulses 710 output 534 from buffer 532. Alternatively, the detector 536 may determine the peak-mean-squared or peak-root-mean-squared voltage of the series of the composite pulses. As yet another alternative, the detector 536 may return measurements (which may be digitized) of a variety of possible voltage parameters of the composite pulses to controller 408 in tester 401, which may determine peak-mean-squared or peak-root-mean-squared voltage of the composite pulses from the measurements taken by the detector 536. As is known, RMS voltage corresponds to power. (As mentioned above, the output 534 of buffer 532 may be filtered by optional filter 580.) Since only a relative power measurement is required for operation, the detector could alternately just be a simple squaring and averaging circuit. For example, the compound waveform voltage may be squared by detector 536 using an analog mixer, which produces an alternating current signal having twice the frequency and a direct current component. The alternating current signal may be removed using a low pass filter, or alternatively, the alternating current signal may be converted to a digital amplitude data. The power in the composite signal corresponds to the direct current component or the digitized alternating component. Regardless of how the detector 536 is configured, the detector 536 may optionally include an analog-to-digital converter as needed by the tester's controller 408 of FIG. 1.

At step 908, the timing offset of the drive channel selected at step 904 is changed, which changes the timing at which pulses are input to the driver of the selected channel, which in turn changes the shape of the composite pulses 710 (by changing the alignment of the pulses in the composite pulses 710). At step 910, the power of the composite pulse (now changed due to the change of the offset at step 908) is again determined. At step 912, it is determined whether the power in the composite pulse reached a peak power. If not, the timing offset of the drive channel selected at step 904 is again changed at step 908, and the power of the composite pulse is again determined at step 910. (The timing offset may optionally be changed at step 908 in the direction of the change in power; that is, if the power decreased, the timing offset is decreased, and if the power increased, the timing offset is increased.) The steps of changing the offset at step 908 and reading the power at step 910 are repeated until a peak power in the composite pulse 710 is found at step 912, after which, it is determined at step 914 whether all of the drive channels have been calibrated. If not, a new drive channel is selected at step 904 and steps 906, 908, 910, and 912 are repeated until an offset corresponding to a peak power in the composite signal 710 is found for the newly selected drive channel. After such an offset has been found for all of the drive channels, the process of FIG. 9 ends. Alternatively, the process of FIG. 9 may be repeated two or more times (without repeating step 902). Depending on the magnitude of the initial skew, repeating the process of FIG. 9 two or more times without (repeating step 902) will improve the accuracy and resolution of the offsets.

Referring again to FIG. 6, after the drive channels have been calibrated and/or deskewed at step 604, the compare channels 544 and 546 are calibrated and/or deskewed at step 606. FIG. 10 illustrates an exemplary way of calibrating and/or deskewing the compare channels 544 and 546. FIG. 10 shows the master clock 702 and the pulses 704, 706, and 708 input 502, 504, 506 to drivers 508, 510, and 512 as calibrated or deskewed at step 604. The resulting shape of 1002 and 1006 is exaggerated such that it is obvious that it is the sum of the individual pulses. Ideally, it would not exhibit the exaggerated stepped rising and falling edges. Time delay offset 1010 from the rising edge of master clock 702 is selected for compare channel 544 by aligning compare signal 556 to comparator 550 with a feature in the composite pulse 1002 at the input to comparator 550. Time delay offset 1012 from the rising edge of mater clock 702 is similarly selected for compare channel 546 by aligning compare signal 568 with the same feature in the composite pulse 1006 at the input to comparator 552. Time delay offsets 1010 and 1012 are stored in timing controller 406.

As mentioned above, the process of FIG. 6, including the process of calibrating and/or deskewing the drive channels illustrated in FIG. 9 and the process of calibrating and/or deskewing the compare channels discussed above with respect to FIG. 10, may be implemented in whole or in part as software executing on controller 408. (Alternatively, the process illustrated in FIG. 6 may be implemented in hardwired circuitry or in a combination of software and hardwired circuitry.) For example, controller 408 may issue control signals over bus 404 that causes the test data generator 402 to generate series of pulses as discussed above with respect to step 602 of FIG. 6. The controller 408 may then issue control signals over bus 404 that causes timing controller 406 to set the time delay offsets for drive channels 514, 516, and 518 to be the same value as discussed above with respect to step 902 of FIG. 9. The controller 408 may then select a drive channel to be calibrated as discussed above with respect to step 904 of FIG. 9. Detector 536, configured to detect RMS voltage or other measurements of the series of composite pulses as discussed above, may digitize RMS voltage readings of the composite pulse 710 and send the digitized readings to the controller 408 via spare channel 548. Controller 408 may then store the digitized RMS voltage reading, which is proportional to the power in the composite pulses 710 output 534 by buffer 532, also as discussed above. Controller 408 may then issue control signals over bus 404 that causes timing controller 406 to change the delay timing offset for the selected driver channel, as discussed above with respect to step 908. Controller 408 may then read the RMS voltage (which is proportional to power) of the resultant composite pulse 710 output 534 by buffer 532 at step 910, and repeat steps 908 and 910 until detecting a peak power reading at step 912. Peak power may be determined by the controller 408 by detecting a change in RMS voltage readings from detector 536 that shows a change from increasing readings to decreasing readings. Controller 408 may repeat steps 904, 906, 908, 910, and 912 calibrating each of the drive channels, until determining at step 914 that all drive channels have been calibrated. As mentioned above, controller 408 may be programmed to repeat the process of FIG. 9 two or more times to obtain greater accuracy in the offsets determined for each drive channel. Connections (not shown in FIG. 4 or 5) may be made between the comparators 550, 552 in each compare channel 544, 546 and controller 408 so that controller 408 is able to automatically align compare signals 556, 568 with composite pulses 1002, 1006 appearing at the comparators 544, 546 as discussed above with respect to step 606 of FIG. 6.

Figure 11:
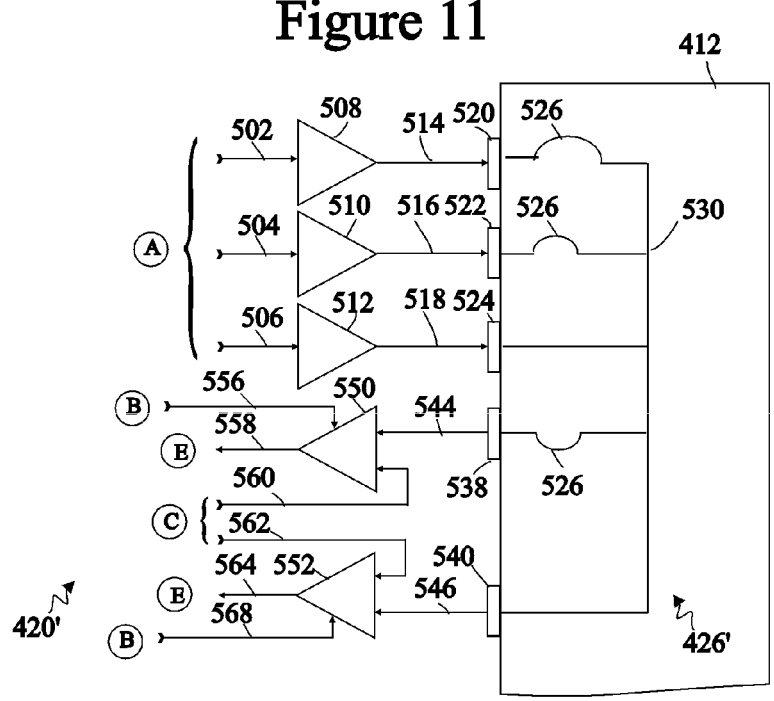
FIG. 11 illustrates a portion of the tester and calibration substrate of FIG. 4 and another exemplary configuration of a set of calibration circuitry.

As mentioned above, the calibration circuitry 426 illustrated in FIG. 5 is exemplary only. FIG. 11 illustrates another exemplary configuration 416' of calibration circuitry 426. In FIG. 11, as in FIG. 5, the signals received at input terminals 520, 522, and 524 are summed at summing junction 530 and the composite signal is output via output terminals 538 and 540 to compare channels 544 and 546. Missing from FIG. 11, however is buffer 532 and detector 536. In the example shown in FIG. 11, the function performed by detector 536 is implemented in software running on controller 408 in tester 401 (see FIG. 4), in hardware located in tester 401, or in a combination of software and hardware. There is, therefore, no need for a calibration channel 548, and it too is missing from FIG. 1. The detector (not shown in FIG. 11 but implemented in tester 401) analyzes the composite signal on one of compare channels 544 or 546 but otherwise may be configured to function like the detector 536 as described above. The calibration circuitry 426' may generally operate as illustrated in FIGS. 6-10.

Figure 12:
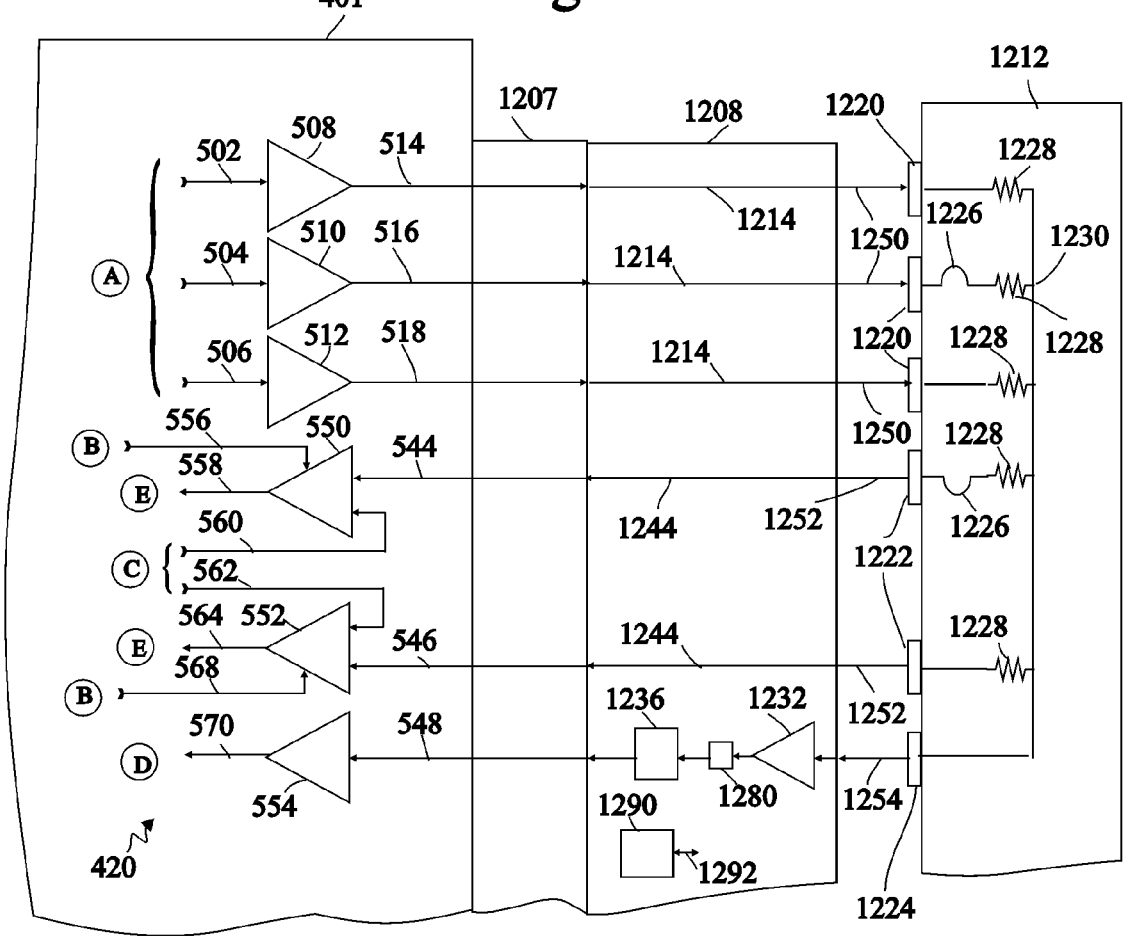
FIG. 12 illustrates a portion of the tester of FIG. 4, a test head, a probe card, and a portion of another exemplary calibration substrate.

FIG. 12 illustrates an exemplary embodiment in which calibration circuitry is disposed at least in part on a probe card 1208, which may be generally similar to probe card 108 in FIG. 1. FIG. 12 illustrates a partial view of tester 401 of FIG. 4 showing the first channel group 420. Channels 514, 516, 518, 544, 546, and 548 connect to and pass through test head 1207, which may be generally like test head 107 in FIG. 1. From test head 1207, channels 514, 516, 518, 544, 546, and 548 connect to a probe card 1208. Probes 1250 of probe card 1208 are disposed to contact input terminals of a DUT (not shown), and probes 1252 are disposed to contact output terminals of a DUT during testing of the DUT. During calibration, probes 1250 contact input terminals 1220 of calibration substrate 1212, and probes 1252 contact output terminals 1222 of calibration substrate 1212. Electrical connections 1214 electrically connect through probe card 1208 drive channels 514, 516, and 518 and probes 1250, and electrical connections 1244 electrically connect compare channels 544 and 546 with probes 1252. In this example, probe 1254 is a calibration probe used for calibration, and it is disposed to contact calibration output terminal 1224 on calibration substrate. (As mentioned above, a calibration channel may be a channel normally used to provide power or ground during testing, a channel that corresponds to an unused probe, a compare channel, a channel that corresponds to an input and/or output terminal on a DUT that does not require calibration or that is calibrated in a separate step or procedure, or any channel that is used to return data to the tester 401 for calibration of another channel; similarly, a "calibration probe" may be a probe that corresponds to any such calibration channel.) As shown in FIG. 12, calibration probe 1254 connects to calibration channel 548 through a buffer 1232, filter 1280, and detector 1236. (Detector 1236 may include an analog-to-digital detector (not shown) so that its output is in digital format.) Calibration substrate 1212 includes a summing junction 1230 (which may be similar to summing junction 580 in FIGS. 5 and 11) that combines signals from input terminals 1220 and outputs the combined signal to output terminals 1222 and calibration output terminal 1224. A set of probes 1250, 1252, and 1254, electrical connections 1214 and 1244, and circuit elements 1232, 1280, and 1236 may be included for each channel group (e.g., 420, 422, and 424) in tester 401 (see FIG. 4). Resistors 1228 and zigs, zags, or curves 1226 may be generally similar to resistors 528 and zigs, zags, or curves 526 in FIG. 5 and serve the same purposes. Calibration substrate 1212 may be generally similar to calibration substrate 412. Likewise, buffer 1232, filter 1280, and detector 1236 may be generally similar to like named elements in FIG. 5.

As shown, the embodiment shown in FIG. 12 may be generally similar to FIG. 5, except that circuit elements 1232, 1280, and 1236 are disposed on a probe card. (As mentioned above, channels 514, 516, 518, 546, and 548 in FIG. 5 may be connected to calibration substrate 412 through a probe card (not shown in FIG. 5).) Operation of the embodiment shown in FIG. 12 may, therefore, be generally as shown in methods shown in FIGS. 6-10.

Probe card 1208 may also include a memory 1290 for storing time delays or offsets determined using the calibration techniques described herein. Input/output port 1292 provides access to memory 1292. As just one example, time offsets that deskew the electrical connections 1214 and 1244 through the probe card may be determined using the calibration techniques described herein and stored in memory 1290. Later, when the probe card is connected to test head 1207 and is about to be used to test DUTs, the time offsets can be uploaded through input/output port 1292 to tester 401. Uploading may be through a tester channel or may be through other means, such as a special communications link.

Of course, the embodiment shown in FIG. 12 is exemplary only, and circuit elements 1232, 1280, and 1236 may be disposed in other locations. For example, one or more of buffer 1232, filter 1280, and/or detector 1236 may be disposed on calibration substrate 1212, tester 401, or another entity (not shown).

Figure 13:
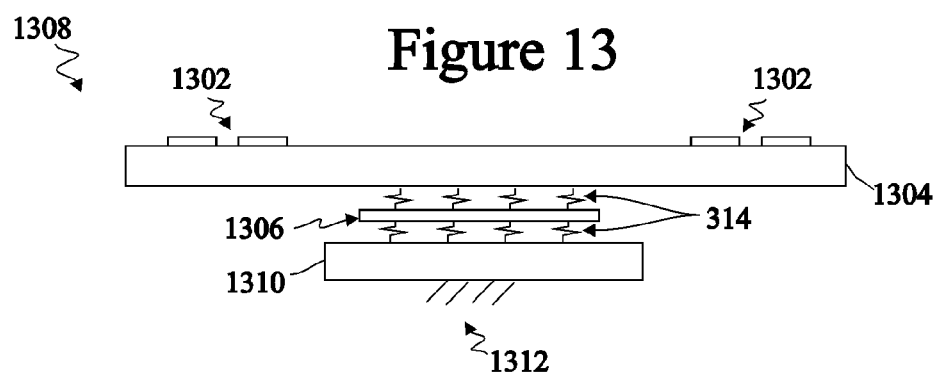
FIG. 13 illustrates an exemplary probe card.
Figure 14:
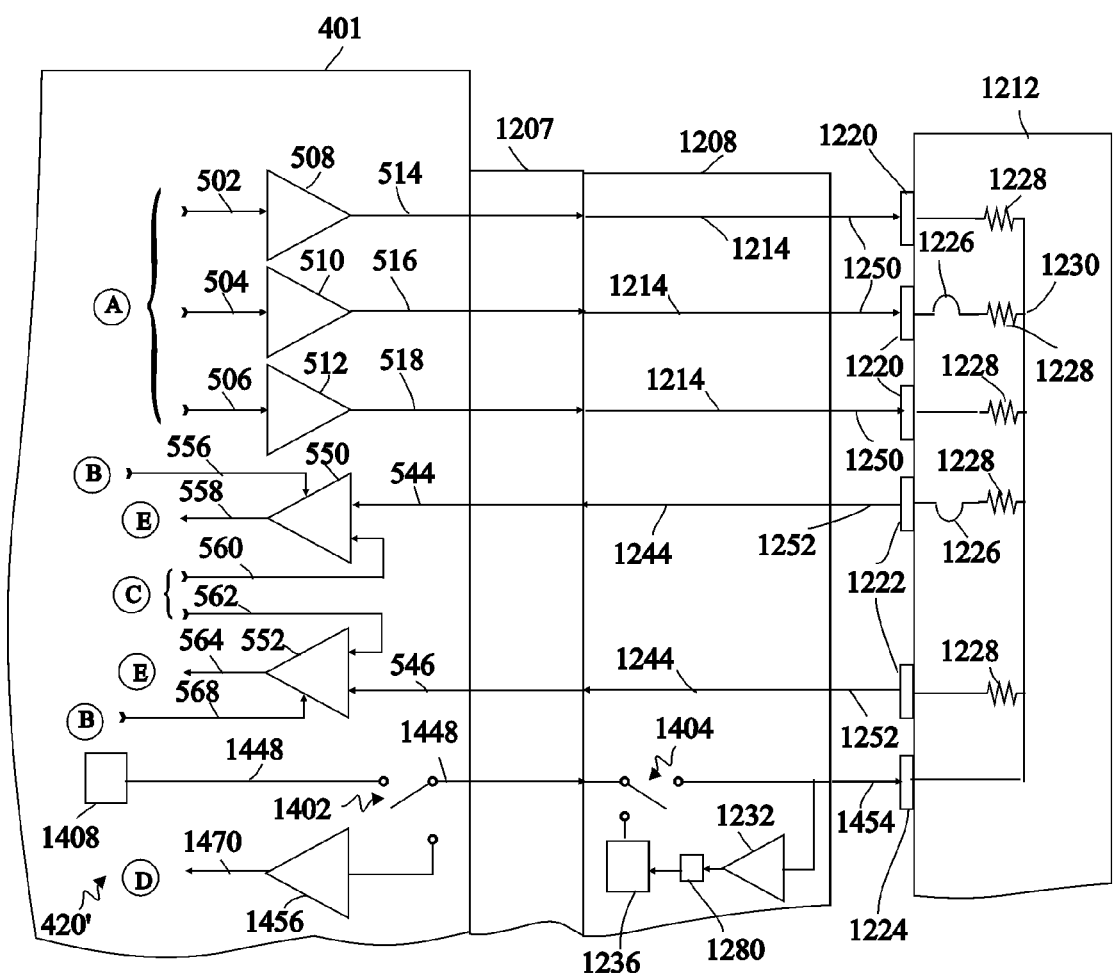
FIG. 14 illustrates another exemplary probe card.

FIG. 13 illustrates an exemplary multi-substrate probe card 1308, which may be used in FIG. 12 as probe card 1208 (or FIG. 14 as probe card 1208'). As shown, probe card 1308 includes a printed circuit board 1304 with pads 1302 for making electrical connections with a test head (e.g., 1207). Probes 1312 for contacting a DUT (not shown) are located on a probe head substrate 1310, which may be a ceramic substrate. (Probes 1312 may also include one or more calibration probes for contacting a calibration substrate (e.g., probes 1312 may include probes such as 1250, 1252, and 1254 in FIG. 12).) An interposer 1306, which includes flexible electrical connections 1314, electrically connects the printed circuit board 1304 with the probe head substrate 1310. Brackets (not shown) may secure the probe head substrate 1310 to the printed circuit board 1304. Electrical connections (not shown in FIG. 13) form electrical paths from pads 1302 through the printed circuit board 1304 to the interposer 1306, through the interposer 1306 to the probe head substrate 1310, and through the probe head substrate 1310 to the probes 1312. Similar probe card configurations are disclosed in U.S. Pat. No. 5,974,662, which is incorporated herein in its entirety by reference. All or any part of the calibration circuit elements (e.g., the buffer 1232, the filter 1280, and/or the detector 1236 may be disposed on any of substrates 1304, 1306, or 1312 of the probe card 1308 of FIG. 13. Likewise, memory 1290 may be disposed on any of substrates 1304, 1306, or 1312.

FIG. 14 illustrates an exemplary embodiment that is similar to the embodiment shown in FIG. 12 except a tester channel 1448 that is used to supply power to a DUT (not shown) during testing of the DUT can be configured to act as a calibration channel during calibration. Test head 1207 and calibration substrate 1212 in FIG. 14 are the same as like named and numbered elements in FIG. 12. Test channel group 420' and probe card 1208' are nearly the same as like named and number elements in FIG. 12.

In FIG. 14, test channel group 420' does not include an unused channel (548 in FIG. 12). Shown in FIG. 14, however, is a power channel 1448 that is used to supply power from a power source 1408 to a DUT (not shown) during testing of the DUT. (Note that channels for supplying power and similar channels for supplying ground connections would be provided by the tester 401 in the embodiments shown in FIGS. 5 and 11 but are not shown in those figures for simplicity. Note also that additional channels for supplying ground connections and additional power connections may be included in the embodiment shown in FIG. 14 but again are not shown for simplicity.)

During testing of a DUT (not shown), switch 1402 in tester 401 and switch 1404 on probe card 1208' are set such that there is a connection from the power source 1408 through channel 1448 and probe card 1208' to probe 1454, which contacts a power terminal on the DUT (not shown). During calibration, however, switch 1402 in tester 401 is set to switch power channel 1448 to calibration acquisition block 1456 (whose output 1470 provides input 1418 to controller 408 of tester 401 (see FIG. 4)), and switch 1404 on probe card 1208' is set to connect probe 1454 to buffer 1232, filter 1280, and detector 1236 on probe card 1208'. (Probe card 1208' may also include a memory 1290 (see FIG. 12) as well as other circuit elements.) Probe 1454 contacts calibration output terminal 1224. Thus, during calibration, power channel 1448 and power probe 1454 are used to return calibration data to tester 401 (in which case power channel 1448 is configured to act also as a calibration channel and power probe 1454 is configured to act also as a calibration probe). Rather, than use a power channel 1448 as a calibration terminal, as shown in FIG. 14, one of the compare channels 544 or 546 (and corresponding electrical connections 1244 through probe card 1208') could be configured to act as a calibration channel during calibration of the drive channels. Likewise, any tester channel not used during calibration or during a part of calibration could be configured to act as a calibration channel during calibration. Note that the embodiment shown in FIG. 14 may operate as illustrated in FIGS. 6-10.

Although exemplary embodiments and applications of the invention have been described herein, there is no intention that the invention be limited to these exemplary embodiments and applications or to the manner in which the exemplary embodiments and applications operate or are described herein. For example, any of the communications channels discussed above may optionally be configured to function as a drive channel or a compare channel or both. As another example, rather than using a spare channel to return the output of detector 536 to the tester 401, a compare channel (e.g., 544, 546) may be used to return the output of detector 536 to the tester 401. Alternatively, an extra power or ground channel (a channel configured to provide power or ground to a DUT) may be used to return the output of detector 536 to the tester 401. As another example, detector 536 may be located at any point along a compare channel, including at a comparator in the tester. As yet another example, tester 401 in FIG. 4 may be configured to test any number of DUTs at once or any type of DUT. As still another example, the square or rectangular pulses illustrated in the figures may be replaced by any shaped pulses. As yet another example, the channels need not be calibrated or deskewed on a per-DUT basis. As still another example, any type of probe card or contactor that provides an interface between one or more DUTs and a tester may be used as the probe card 1208 in FIG. 12.

The invention claimed is:

1. A calibration substrate for use in calibrating/deskewing drive channels of a machine, said machine having a plurality of first drive channels and a compare channel, said calibration substrate comprising:
   a plurality of first input terminals disposed to receive input from said plurality of first drive channels;
   a first buffer, wherein said first input terminals are electrically connected to an input of said first buffer;
   a first detector configured to receive as input an output of said first buffer; and
   a first output terminal electrically connected to an output of said first detector and configured to connect electrically with said compare channel.

2. The calibration substrate of claim 1, wherein said machine comprises a plurality of first compare channels, said calibration substrate further comprising a plurality of additional first output terminals each electrically connected to said input of said first buffer and configured to connect electrically with said plurality of first compare channels.

3. The calibration substrate of claim 2, wherein said machine comprises a plurality of second drive channels and a second compare channel, said calibration substrate further comprising:
   a plurality of second input terminals disposed to receive input from said plurality of second drive channels;
   a second buffer, wherein said second input terminals are electrically connected to an input of said second buffer;
   a second detector configured to receive as input an output of said second buffer; and
   a second output terminal electrically connected to an output of said second detector and configure to connect electrically to said second compare channel.

4. The calibration substrate of claim 3, wherein said machine comprises a plurality of second compare channels, said calibration substrate further comprising a plurality of additional second output terminals each electrically connected to said output of said second buffer and configured to connect electrically to said plurality of second compare channels.

5. The calibration substrate of claim 1, wherein electrical paths connecting said first input terminals to said input of said first buffer are of equal length.

6. The calibration substrate of claim 1 further comprising a plurality of resistors disposed between said first input terminals and said input of said first buffer.

7. The calibration substrate of claim 6, wherein said resistors are sized and disposed to match an impedance of said drive channels.

8. The calibration substrate of claim 1 further comprising an electronic filter disposed to filter said output of said first buffer.

9. The calibration substrate of claim 1, wherein said machine is a tester.

10. A calibration substrate for use in calibrating/deskewing a tester with a probe card assembly, said probe card assembly having a plurality of probes, said calibration substrate comprising:
   a substrate;
   a plurality of input terminals disposed on a same surface of said substrate and arranged in position to be contacted by said plurality of probes;
   a summing node, wherein each of said input terminals are electrically connected to said summing node;
   a detector having an input and an output, said input connected to said summing junction, said detector configured to detect a composite pulse feature of a composite pulse created at said summing junction; and
   an output terminal disposed on said surface and electrically connected to said output of said detector and arranged in position to be contaced by a probe of said probe card assembly.

11. The calibration substrate of claim 10, wherein electrical paths connecting said input terminals to said summing junction are of equal length.

12. The calibration substrate of claim 10 further comprising a plurality of resistors disposed between said input terminals and said summing junction.

13. The calibration substrate of claim 10 further comprising a buffer disposed between said summing junction and said detector.

14. The calibration substrate of claim 10 further comprising an electronic filter disposed between said detector and said output terminal.

15. The calibration substrate of claim 10 wherein said detector is a power detector.

16. The calibration substrate of claim 10, wherein said detector is a pulse width detector.

17. The calibration substrate of claim 10, wherein said detector is a pulse slope detector.

18. The calibration substrate of claim 10, wherein said detector comprises any of: a power detector, a pulse width detector, and a pulse slope detector.

* * * * *